United States Patent
Roberts, II et al.

(10) Patent No.: US 12,363,853 B2
(45) Date of Patent: Jul. 15, 2025

(54) DIRECT INSTRUMENT-TO-INSTRUMENT COMMUNICATION WITHOUT USING A SYSTEM CONTROLLER

(71) Applicant: Keithley Instruments, LLC, Solon, OH (US)

(72) Inventors: Gregory Roberts, II, Cleveland, OH (US); William C. Weeman, Aurora, OH (US)

(73) Assignee: Keithley Instruments, LLC, Solon, OH (US)

( * ) Notice: Subject to any disclaimer, the term of this patent is extended or adjusted under 35 U.S.C. 154(b) by 137 days.

(21) Appl. No.: 17/963,114

(22) Filed: Oct. 10, 2022

(65) Prior Publication Data

US 2023/0115051 A1 Apr. 13, 2023

Related U.S. Application Data

(60) Provisional application No. 63/254,989, filed on Oct. 12, 2021.

(51) Int. Cl.
*H05K 7/14* (2006.01)
*G06F 13/42* (2006.01)

(52) U.S. Cl.
CPC ....... *H05K 7/1492* (2013.01); *G06F 13/4265* (2013.01); *H05K 7/1491* (2013.01)

(58) Field of Classification Search
CPC ............. G06F 13/4221; G06F 13/4265; G06F 13/4282; G06F 2213/0026; H05K 7/1491; H05K 7/1492
See application file for complete search history.

(56) References Cited

U.S. PATENT DOCUMENTS 6,981,086 B2 * 12/2005 Wetzel ................... G01D 21/00
710/301
2013/0223236 A1 * 8/2013 Dickey ................. H04L 12/403
370/458

* cited by examiner

*Primary Examiner* — Idriss N Alrobaye
*Assistant Examiner* — Dayton Lewis-Taylor
(74) *Attorney, Agent, or Firm* — Miller Nash LLP; Andrew J. Harrington; Krista Y. Chan (57) ABSTRACT

A configurable instrument includes a mainframe having one or more processors, a chassis having slots to accept one or more instrument modules, a communication bus coupled to all of the instrument modules inserted in the slots, and a communication backplane, separate from the communication bus, and configured to allow point-to-point communication between any pair of modules inserted in the slots.

21 Claims, 4 Drawing Sheets

DIRECT INSTRUMENT-TO-INSTRUMENT COMMUNICATION WITHOUT USING A SYSTEM CONTROLLER

CROSS-REFERENCE TO RELATED APPLICATIONS

This disclosure claims benefit of U.S. Provisional Application No. 63/254,989, titled "DIRECT INSTRUMENT-TO-INSTRUMENT COMMUNICATION WITHOUT USING A SYSTEM CONTROLLER," filed on Oct. 12, 2021, the disclosure of which is incorporated herein by reference in its entirety.

TECHNICAL FIELD

This disclosure relates to test and measurement instruments, and more particularly to techniques for direct instrument-to-instrument communication without using a separate system controller.

BACKGROUND

Test and measurement instruments sometimes share data between components or modules to coordinate their operations, particularly when operating as a single virtual instrument. In this context, instruments may also be referred to as modules; for example, multiple modules may be installed in an instrument mainframe. The instrument mainframe may be customized by selecting and adding particular modules to the instrument mainframe. Coordinating triggering between instruments based on certain operational or testing conditions is useful to sequence operations between instruments.

One example of a previous solution for coordinating instrument operations is a PXI Local Bus, which provides multiple, daisy-chained, analog connections. A PXI Local Bus is a bus that conforms to the PXI Specification, which is administered by the PXI Systems Alliance. The PXI standard includes extensions made to the PCI (Peripheral Component Interconnect) specification that are relevant to instrumentation and automation users. The PCI specification defines hardware and software requirements to operate according to the PCI standard. Having common hardware and software requirements allows various manufacturers to develop products that communicate with one another, according to the PCI standard.

Figure 1:
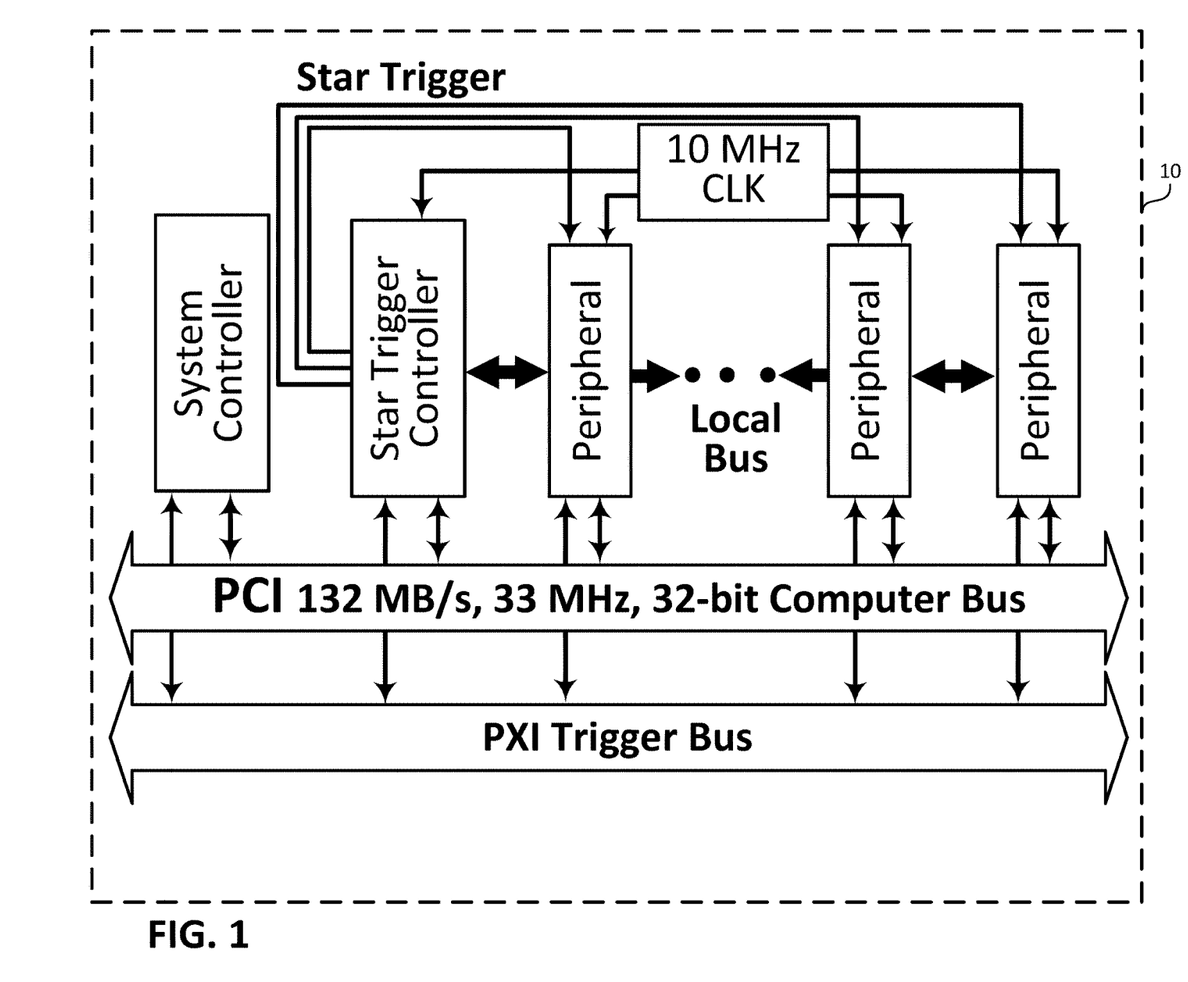
FIG. 1 is a block diagram of a conventional communication bus and controller.

FIG. 1 shows a block diagram of a communication sub-system 10 in a device (not illustrated) that includes a PCI bus as well as a PXI Local bus, which includes support for PXI Triggers. The PCI bus is shared between each of the Peripheral modules on the PCI bus, and overall coordination of bus communications is managed by the System Controller. The System Controller manages communications between the PCI bus and the main host, or instrument, that includes the PCI bus. Operating the communication system between peripherals illustrated in FIG. 1 suffers from many disadvantage, including operational overhead due to the necessity of being managed by the system controller. The PCI bus may also experience rather long latency times, especially if one of the peripherals is sending large amounts of data and tying up the PCI bus.

Embodiments according to the disclosure address some of these shortcomings of conventional communication systems.

DESCRIPTION

Figure 2:
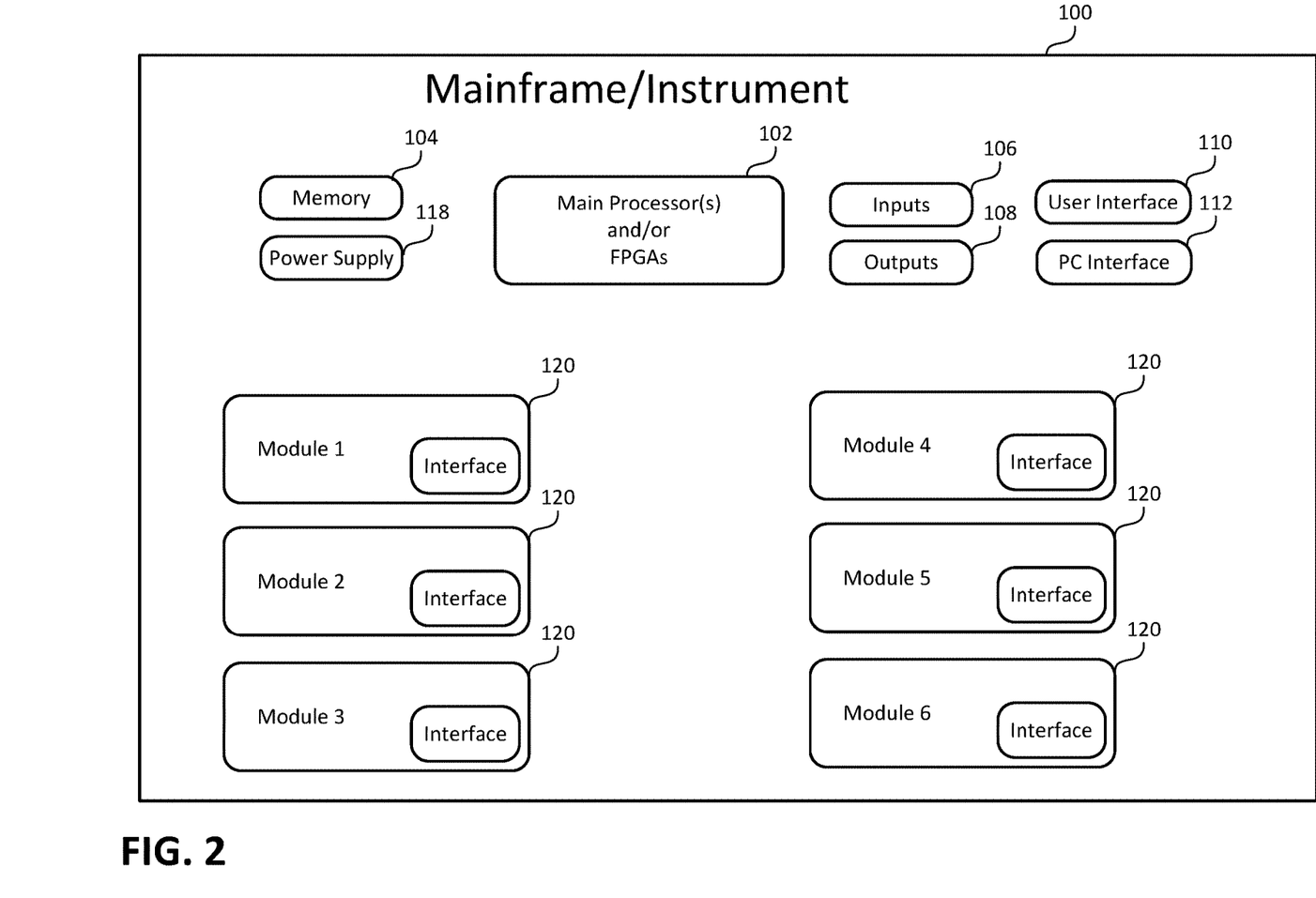
FIG. 2 is a block diagram of an instrument, or mainframe, that includes multiple modules linked by a module-to-module communication system, according to embodiments of the disclosure.

In contrast to the conventional communication system of FIG. 1, FIG. 2 shows an example block diagram of an instrument, or mainframe 100, that includes multiple modules linked by a module-to-module communication system, according to embodiments of the disclosure. In general, this disclosure will refer to an instrument as a mainframe 100. The mainframe 100 may include multiple modules 120, which may be inserted into or removed from the mainframe. Various modules 120 may provide different functions and functionality. Selection of which of the individual modules 120 to include in the mainframe 100 allows the user to customize the mainframe and select only those modules needed to perform the desired instrument function. Thus, the selection of which modules 120 to include in the mainframe 100 determines the functionality of the instrument created by the mainframe and its associated modules 120.

The mainframe 100 may physically include a chassis with a number of receiver slots to physically accept one or more modules 120. Although only six slots are illustrated in FIG. 2, the mainframe 100 may include any number of module slots. The mainframe 100 includes typical components for providing functionality common to many types of instruments, such as one or more processors 102, memory 104 for storing instructions or data, inputs 106 for receiving one or more signals to be processed, and outputs 108 for sending one or more signals to external equipment or devices. In some embodiments, the one or more processors 102 may embodied by or coupled to various microcontrollers and/or FPGAs (Field Programmable Gate Arrays). Including one or more FPGAs in the mainframe 100 allows rapid development and a process to increase functionality by reprogramming the FPGAs to updated versions. The mainframe 100 includes a user interface 110, which may include any of a variety of knobs, switches, touchscreen, display screen, keyboard or mouse inputs, etc. through which a user may interact, control, and receive information from the mainframe. The mainframe 100 may further include a PC interface 112 through which it can receive programmatic controls or through which it can couple to a remote computer for remote operation. The mainframe 100 also includes one or more power supplies 118 to provide its own internal power and also to provide power signals to the modules.

The mainframe 100 includes at least one, and typically two or more slots, each for accepting a module 120. As described above, each module 120 may provide a separate function to the mainframe 100. Each slot may include one or more module interfaces with physical connections for supporting each module, and electrical connections for communicating with each module. In some embodiments the module interfaces of the modules 120 include edge card connectors, which physically couple communication and power wires between the mainframe 100 and modules 120. The module interface also allows the modules 120 to communicate directly with one another, as described in further detail below. Some modules 120 may include multiple, separate, input or output channels for interacting with devices coupled to them. In some embodiments, the modules 120 are hot-swappable, meaning that modules may be inserted into the mainframe 100 or removed from the mainframe while the mainframe is powered and in operation. Also, in some embodiments, riser or mezzanine boards in the mainframe 100 may be used to electrically couple one or more modules 120 to its slot. Each module 120 is powered by the power supply 118 through a power connection in its interface, or may further include a connection for external power.

Examples of particular modules 120 that may be used in the mainframe 100 include Source Measure Units (SMUs), Power Supplies, Digital Multi-Meters (DMMs), Pulse Measure Units (PMUs), Pulse Generators, Oscilloscopes, Electrometers, or any other type of instrument. Modules 120 also typically include their own input, output, or both an input and output for coupling to devices that are being measured by and/or sending signals to the mainframe 100, and/or receiving one or more signals from the mainframe.

Figure 3:
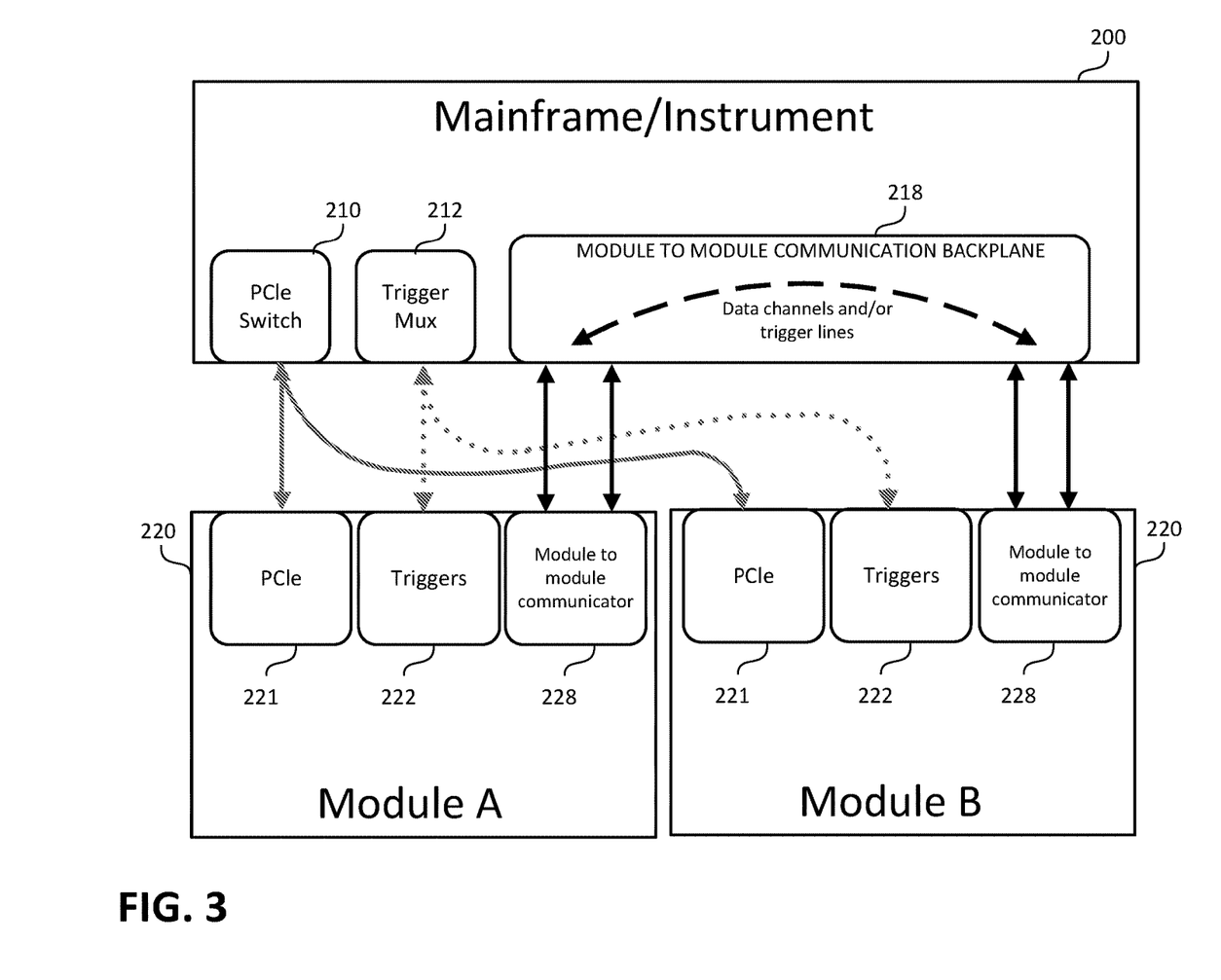
FIG. 3 is a block diagram that functionally illustrates the module-to-module communication system that operates on the mainframe of FIG. 2, according to embodiments of the disclosure.

FIG. 3 is a block diagram that functionally illustrates the module-to-module communication system that operates on the mainframe of FIG. 2, according to embodiments of the disclosure. As shown in FIG. 3, a mainframe 200, which may be an example of the mainframe 100 of FIG. 2, includes a module-to-module communications backplane 218, which facilitates two modules 220 communicating directly with one another, without a necessity of using any separate communication controller on the mainframe 100 itself. Each module 220 of FIG. 3, Module A and Module B, may be examples of any of the modules 120 described with reference to FIG. 2. Also, although only two modules 220 are illustrated in FIG. 3, for clarity, the module-to-module communication backplane 218 works between any two particular modules that are inserted into slots in the mainframe 200.

Communication lines within the module-to-module communications backplane 218 generally provide configurable communications lines via a side-band channel that does not require a system controller to process the communication. The communication system provides routing resources to connect the instruments together directly through the module-to-module communications backplane 218, which also may be referred to as a side-band channel. The communications backplane 218 channel may contain multiple, individual links, described below, which can be grouped together to increased communication bandwidth, or to provide synchronization, for example for triggering purposes.

With reference to FIG. 3, in some embodiments, each module 220 includes a PCIe (Peripheral Component Interconnect express) component 221 as well as a triggers component 222. These components 221, 222, allow each module 220 to communicate with the mainframe 200 using a PCIe bus and potentially even a PXI bus in conventional methods. The mainframe 200 includes a PCIe switch 210 and trigger multiplexer, or mux 212, to facilitate this conventional communication between each of the modules 220 and the mainframe 200, through the component 221 and triggers component 222 of each module.

In addition to these conventional components, each module 220 includes a local, module-to-module communicator 228 that operates in conjunction with the communications backplane 218 of the mainframe 100 to allow any module to send data, command, triggers, or other information directly from one module to another, for example, from Module A to module B. Note that this module-to-module communication is completely separate from any data communication through the PCIe switch 210 or trigger mux 212 of the mainframe 200. In some embodiments the communication backplane 218 as well as the module-to-module communicator 228 of each module 220 are embodied by FPGAs, which allows them to be readily reconfigured.

Figure 4:
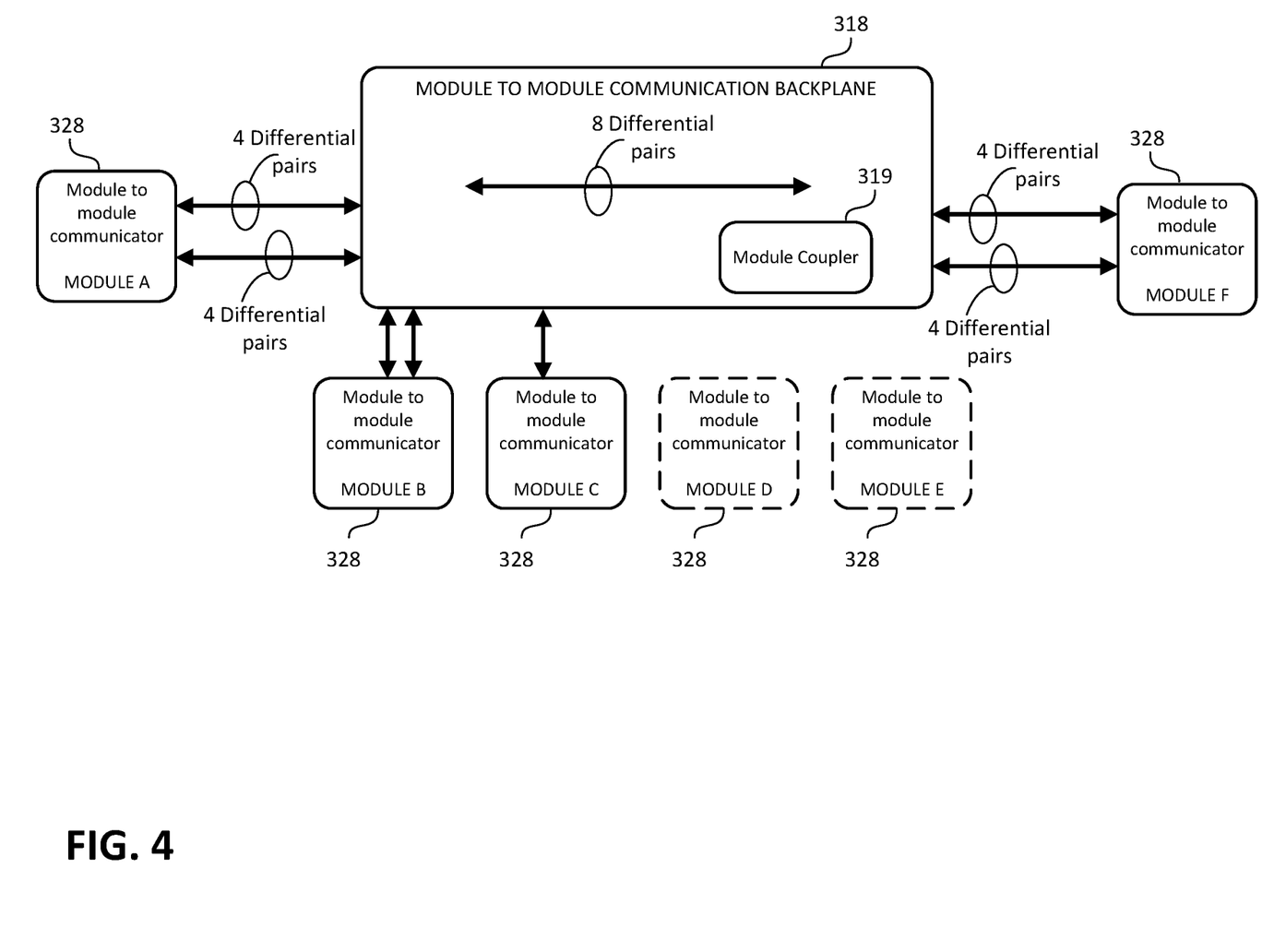
FIG. 4 is a block diagram illustrating further details of the module-to-module communication system according to embodiments of the disclosure.

FIG. 4 illustrates communication details between each of the modules, across a communication backplane 318 that is resident in a mainframe. The communication backplane 318 illustrated in FIG. 4 may be an example of the communication backplane 218 of FIG. 3. In the illustrated embodiment, the communication backplane 318 includes 8 differential pairs of communication lines, although in other embodiments any number of communication lines may be present. In some embodiments, each module-to-module communicator 328 of each module includes one or two sets of 4 communication lines. In embodiments, each individual communication line is made up of a differential pair of lines, meaning that information for each communication line is carried by this pair of wires. For those embodiments that include one set of 4 communication lines, 8 separate communication lines, grouped in differential pairs, link from the module-to-module communicator 328 to the communication backplane 318. For those embodiments that include two sets of 4 communication lines, 16 separate communication lines link to the module-to-module communicator 328 to the communication backplane 318. The communication lines may be embodied by any electrical connection, such as discrete or coupled wires, Printed Circuit Board (PCB) traces, electrical connectors, or any other electrical communication medium. Although the communication lines are referred to as wires below, for brevity, in fact any electrical connection suitable for the implementation could be used in embodiments. The communication backplane 318 further includes a module coupler 319, which functions to establish communication between any two modules across one or more of the differential pairs of communication wires, as described further below. In one embodiment this module coupler 319 is embodied by or a function of a programmed FPGA.

Recall from above that not all module slots of a mainframe need to be filled, and that each module may have one or two sets of 4 communication lines. With reference to FIG. 4, Module D and Module E are illustrated in dashed line to indicate that they are not present within a mainframe. Further, Modules A, B, and F each include two sets of 4 communication lines, while Module C has only one set. The ability to select and match particular modules, which may each have different capabilities and resources, for a mainframe provides flexibility and a degree of customization not found in other instruments.

In some embodiments, each channel of data communication is sent between modules, through the communication backplane 318, using Low Voltage Differential Signal (LVDS) pairs with High Speed Transceiver Logic (HSTL), Class II, 1.8 V electrical signaling standard, although other communication standards may be used. Although the LVDS standard is specifically for sending and receiving digital signals, other standard could carry analog signals on the communication lines. At startup, a mainframe may initialize each module-to-module communicators 328 in each of the connected modules, as well as the communication backplane 318, such as by communicating with an FPGA in each of the communicators 328 and backplane 318. Such initialization provides an address for the module itself, as well as an address for each of the other modules. Communication between modules over the communication lines is point-to-point communication, meaning that only the two modules that are in communication with one another participate in the communication, and the modules ignore communication that they are not a party to. There are a variety of pre-determined commands for operating the communication channel. Channels may be set up by opening and configuring a data communication channel, which, as described above, opens a channel between a single sending device and a single receiving device. A module may open any open channel, which is determined by monitoring the channel for a time period to determine whether any communication traffic is already on the channel. Such communication traffic would indicate that the particular channel is already in use by a pair of modules. After determining that a channel is not currently being used, the sending module may send a request to another module to establish the communication channel. When the receiving module indicates that it is ready to receive, the communication channel is opened and available for the modules to communicate with one another. When the communication is finished, the channel may be closed, which releases the resources of that particular channel for a subsequent communication process.

In other embodiments, management of the communication channels may be performed by the communication backplane 318, in cooperation with the module coupler 319 (FIG. 3). In such an embodiment, a communicator 328 may open a communication channel by sending a request to the communication backplane 318 to open a new communication channel. In response, the communication backplane 318 allocates one or more of the differential pairs as a resource, couples the involved modules to the selected differential pair, and sends a message to the receiving module to open one of its particular channels for communication with the sending module. Then, after the communication channel is opened, data and information may be sent between the two modules through the point-to-point communication channel that is opened between them. When the need for communication is complete, one of the modules sends a message to the communication backplane 318 to close the channel to make the resource available again. Of course, details of coupling the various modules to one another across a communication backplane 318 may be implementation specific, and may be performed in different ways. Although the example above illustrates point to point communication between two modules, recall that the communication backplane 318 includes multiple communication paths for connecting between modules. So, for example, Module A could have a communication path opened to Module C, at the same time Module B has a communication path with Module D. Or, Module A can open simultaneously establish connections with both Module B and Module F. The number of simultaneous module-to-module connections through the communication backplane 318 is limited only by the physical number of communication lines in the backplane and the number of connections between each module and the backplane.

In practice, modules may open communication channels for a variety of purposes. Some channels may be opened to send interrupt or trigger signals to another module. With reference back to FIG. 3, a trigger may be generated by the trigger mux 212 of the mainframe 200 and sent to a module 220, such as Module A. Then, the Module A could communicate that it has received this trigger by first establishing a communication channel with Module B, and sending the trigger signal to Module B when Module A received the trigger from the mainframe 200. In other operations, modules 220 may send data collected by a first module to a second module. By allowing communication channels to be established between various modules 220, modules may cooperate with one another to perform particular functions not capable of being performed by a single module, or to expand the resources available to the mainframe through the use of multiple, coupled, modules.

In general, data sent on a communication channel between two modules is serial data. In some embodiments, however, multiple communication channels may be simultaneously opened between two modules 220, and data could be sent in parallel fashion. Sending data in parallel may increase the bandwidth of the communication between modules. Or, in some embodiments, it may be simpler to send some data in parallel rather than serially.

As described above, the data sent over the communication channels may include any type of data, such as raw data, measurement data, data received from a device being measured, copies of data sent to a device being tested, command data, digital data, sequencing signals, synchronization data, and trigger signals, for example. In general, any type of data that helps cooperation between two modules of a mainframe configured as an instrument may be communicated over the point-to-point communication channels.

As mentioned above, data communication sent over the point-to-point communication channels between modules may conform to one or more particular communication protocols. In general, the communication protocol selected for such communication will have pre-defined formats for data exchange, addressing, detection of transmission errors, and acknowledgements, for example. Also, in general, each module-to-module communicator 228, 328 includes a memory buffer, where data to be sent across the communication lines is queued for sending, and, for the receiving module, where data received form the communication lines may be stored after receipt.

Benefits of systems incorporating a module-to-module communication system such as described above include an ability to establish point-to-point connections between instrument modules in a configurable way to carry data, commands or triggering signals. The routing resources in the communication backplane 318 creates the direct connection between the side-band channels of the instruments through a configuration interface. Once the routing is established, instrument communication does not consume system controller processing or communication resources.

Aspects of the disclosure may operate on a particularly created hardware, on firmware, digital signal processors, or on a specially programmed general purpose computer including a processor operating according to programmed instructions. The terms controller or processor as used herein are intended to include microprocessors, microcomputers, Application Specific Integrated Circuits (ASICs), FPGAs, soft-core FPGAs, and dedicated hardware controllers. One or more aspects of the disclosure may be embodied in computer-usable data and computer-executable instructions, such as in one or more program modules, executed by one or more computers (including monitoring modules), or other devices. Generally, program modules include routines, programs, objects, components, data structures, etc. that perform particular tasks or implement particular abstract data types when executed by a processor in a computer or other device. The computer executable instructions may be stored on a non-transitory computer readable medium such as a hard disk, optical disk, removable storage media, solid state memory, Random Access Memory (RAM), etc. As will be appreciated by one of skill in the art, the functionality of the program modules may be combined or distributed as desired in various aspects. Particular data structures may be used to more effectively implement one or more aspects of the disclosure, and such data structures are contemplated within the scope of computer executable instructions and computer-usable data described herein.

The disclosed aspects may be implemented, in some cases, in hardware, firmware, software, or any combination thereof. The disclosed aspects may also be implemented as instructions carried by or stored on one or more or non-transitory computer-readable media, which may be read and executed by one or more processors. Such instructions may be referred to as a computer program product. Computer-readable media, as discussed herein, means any media that can be accessed by a computing device. By way of example, and not limitation, computer-readable media may comprise computer storage media and communication media.

Computer storage media means any medium that can be used to store computer-readable information. By way of example, and not limitation, computer storage media may include RAM, ROM, Electrically Erasable Programmable Read-Only Memory (EEPROM), flash memory or other memory technology, Compact Disc Read Only Memory (CD-ROM), Digital Video Disc (DVD), or other optical disk storage, magnetic cassettes, magnetic tape, magnetic disk storage or other magnetic storage devices, and any other volatile or nonvolatile, removable or non-removable media implemented in any technology. Computer storage media excludes signals per se and transitory forms of signal transmission.

Communication media means any media that can be used for the communication of computer-readable information. By way of example, and not limitation, communication media may include coaxial cables, fiber-optic cables, air, or any other media suitable for the communication of electrical, optical, Radio Frequency (RF), infrared, acoustic or other types of signals.

EXAMPLES

Illustrative examples of the technologies disclosed herein are provided below. A configuration of the technologies may include any one or more, and any combination of, the examples described below.

Example 1 is a configurable instrument, including a mainframe having one or more processors, a chassis having slots to accept one or more instrument modules, a communication bus coupled to all of the instrument modules inserted in the slots, and a communication backplane, separate from the communication bus, and configured to allow point-to-point communication between any pair of modules inserted in the slots.

Example 2 is a configurable instrument according to Example 1, in which the point-to-point communication comprises a pair of differential signal lines.

Example 3 is a configurable instrument according to any of the preceding Examples, in which the point-to-point communication comprises more than one pair of differential signal lines.

Example 4 is a configurable instrument according to any of the preceding Examples, in which the point-to-point communication can be configured to carry analog signals or digital signals.

Example 5 is a configurable instrument according to any of the preceding Examples, in which each module inserted in the slots includes a communication interface structured to connect to the communication backplane.

Example 6 is a configurable instrument according to Example 5, in which the communication interface of at least one of the modules inserted in the slots includes four or eight pairs of differential signal lines.

Example 7 is a configurable instrument according to Example 5, in which the communication interface of at least one of the modules inserted into the slots is structured to send a signal received over the communication bus as a point-to-point communication to another of the modules inserted into the slots.

Example 8 is a configurable instrument according to any of the preceding Examples, in which the communication backplane comprises a module coupler to establish the point-to-point communication between any pair of modules inserted in the slots.

Example 9 is a configurable instrument according to Example 8, in which the module coupler of the communication backplane is structured to establish the point-to-point communication between any pair of modules inserted in the slots through a differential pair of signal lines within the communication backplane.

Example 10 is a configurable instrument according to Example 8, in which the module coupler of the communication backplane is structured to establish the point-to-point communication between any pair of modules inserted in the slots through two or more differential pairs of communication lines within the communication backplane.

Example 11 is a configurable instrument according to Example 8, in which module coupler of the communication backplane is structured to simultaneously establish a first point-to-point communication between any pair of modules inserted in the slots and establish a second point-to-point communication between any pair of modules inserted in the slots.

Example 12 is a configurable instrument according to any of the preceding Examples, in which the one or more instrument modules comprise a Source Measure Unit (SMU), Power Supply, Digital Multi-Meter (DMM), Pulse Measure Unit (PMU), Pulse Generator, Oscilloscope, or an Electrometer.

Example 13 is a method of communicating in an instrument including a mainframe having a number of slots each structured to accept an instrument module, the method including establishing a broadcast communication channel on a communication bus between a first instrument module in one of the slots and the mainframe and establishing a point-to-point communication channel between the instrument module and a second instrument module in another one of the slots of the mainframe.

Example 14 is an example according to Example method 13, in which establishing a point-to-point communication channel comprises making a request to a communication backplane in the instrument.

Example 15 is an example according to any of the Example methods above, in which establishing a point-to-point communication channel comprises making a request to the second instrument module.

Example 16 is an example according to any of the Example methods above, in which establishing a point-to-point communication channel comprises coupling the instrument module and the second instrument module through a communication backplane housed in the instrument.

Example 17 is an example according to Example 16, in which the communication backplane comprises one or more pairs of differential signal lines.

Example 18 is an example according to Example 17 in which establishing a point-to-point communication channel comprises coupling the instrument module and the second instrument module through one of the pairs of differential signal lines in the communication backplane.

Example 19 is an example according to any of the Example methods above, further comprising communicating between the instrument module and a second instrument module using a Low Voltage Differential Signaling (LVDS) standard.

Example 20 is an example according to any of the Example methods above, in which the point to point communication channel is a first channel, the method further comprising operating a second point-to-point communication channel between the instrument module and a third instrument module in another one of the slots of the mainframe simultaneously to the first point to point communication channel.

Example 21 is an example according to any of the Example methods above, in which the point to point communication channel is a first channel, the method further comprising operating a second point-to-point communication channel between a third instrument module and a fourth instrument module simultaneously to the first point to point communication channel.

The previously described versions of the disclosed subject matter have many advantages that were either described or would be apparent to a person of ordinary skill. Even so, these advantages or features are not required in all versions of the disclosed apparatus, systems, or methods.

Additionally, this written description makes reference to particular features. It is to be understood that the disclosure in this specification includes all possible combinations of those particular features. Where a particular feature is disclosed in the context of a particular aspect or example, that feature can also be used, to the extent possible, in the context of other aspects and examples.

Also, when reference is made in this application to a method having two or more defined steps or operations, the defined steps or operations can be carried out in any order or simultaneously, unless the context excludes those possibilities.

Although specific examples of the invention have been illustrated and described for purposes of illustration, it will be understood that various modifications may be made without departing from the spirit and scope of the invention. Accordingly, the invention should not be limited except as by the appended claims.

We claim:

1. A configurable instrument, comprising:
 a mainframe, including:
  one or more processors;
  a chassis having slots to accept a plurality of instrument modules;
 a communication bus coupled to all of the plurality of instrument modules inserted in the slots; and
 a communication backplane, separate from the communication bus, comprising a plurality of communication resources configured to create direct connections between any pair of instrument modules through a configuration interface, and the communication backplane configured to allow point-to-point communication between any pair of instrument modules inserted in the slots by allocating an available communication resource of the plurality of communication resources as a direct connection specifically between the pair of instrument modules, coupling the pair of instrument modules to the communication resource, opening the point-to-point communication between the pair of instrument modules, and releasing the communication resource as available once the point-to-point communication is complete.

2. The configurable instrument according to claim 1, in which the point-to-point communication comprises a pair of differential signal lines.

3. The configurable instrument according to claim 1, in which the point-to-point communication comprises more than one pair of differential signal lines.

4. The configurable instrument according to claim 1, in which the point-to-point communication can be configured to carry analog signals or digital signals.

5. The configurable instrument according to claim 1, in which each instrument module inserted in the slots includes a communication interface structured to connect to the communication backplane.

6. The configurable instrument according to claim 5, in which the communication interface of at least one of the one or more instrument modules inserted in the slots includes four or eight pairs of differential signal lines.

7. The configurable instrument according to claim 5, in which the communication interface of at least one of the one or more instrument modules inserted into the slots is structured to send a signal received over the communication bus as a point-to-point communication to another of the one or more instrument modules inserted into the slots.

8. The configurable instrument according to claim 1, in which the communication backplane comprises a module coupler to establish the point-to-point communication between any pair of instrument modules inserted in the slots.

9. The configurable instrument according to claim 8, in which the module coupler of the communication backplane is structured to establish the point-to-point communication between any pair of instrument modules inserted in the slots through a differential pair of signal lines within the communication backplane.

10. The configurable instrument according to claim 8, in which the module coupler of the communication backplane is structured to establish the point-to-point communication between any pair of instrument modules inserted in the slots through two or more differential pairs of communication lines within the communication backplane.

11. The configurable instrument according to claim 8, in which module coupler of the communication backplane is structured to simultaneously establish a first point-to-point communication between any pair of instrument modules inserted in the slots and establish a second point-to-point communication between any pair of instrument modules inserted in the slots.

12. The configurable instrument according to claim 1, in which the one or more instrument modules comprise a Source Measure Unit (SMU), Power Supply, Digital MultiMeter (DMM), Pulse Measure Unit (PMU), Pulse Generator, Oscilloscope, or an Electrometer.

13. A method of communicating in an instrument including a mainframe having a plurality of slots each structured to accept an instrument module and comprising a plurality of communication resources configured to create direct connections between any pair of instrument modules through a configuration interface, the method comprising:
 establishing a broadcast communication channel on a communication bus between a first instrument module in one of the slots and the mainframe; and
 establishing a point-to-point communication channel between the first instrument module and a second instrument module in any other one of the slots of the mainframe by allocating an available communication resource of the plurality of communication resources as a direct connection specifically between the first instrument module and the second instrument module, coupling the first instrument module and the second instrument module to the communication resource, opening the point-to-point communication channel between the first instrument module and the second instrument module, and releasing the communication resource as available once point-to-point communication is complete.

14. The method of communicating in an instrument according to claim 13, in which establishing a point-to-point communication channel comprises making a request to a communication backplane in the instrument.

15. The method of communicating in an instrument according to claim 13, in which establishing a point-to-point communication channel comprises making a request to the second instrument module.

16. The method of communicating in an instrument according to claim 13, in which establishing a point-to-point communication channel comprises coupling the first instrument module and the second instrument module through a communication backplane housed in the instrument.

17. The method of communicating in an instrument according to claim 16, in which the communication backplane comprises one or more pairs of differential signal lines.

18. The method of communicating in an instrument according to claim 17, in which establishing the point-to-point communication channel comprises coupling the first instrument module and the second instrument module through one of the pairs of differential signal lines in the communication backplane.

19. The method of communicating in an instrument according to claim 13, further comprising communicating between the first instrument module and a second instrument module using a Low Voltage Differential Signaling (LVDS) standard.

20. A method of communicating in an instrument including a mainframe having a number of slots each structured to accept an instrument module, the method comprising:
  establishing a broadcast communication channel on a communication bus between a first instrument module in one of the slots and the mainframe;
  establishing a point-to-point communication channel between the instrument module and a second instrument module in any other one of the slots of the mainframe, in which the point-to-point communication channel is a first point-to-point communication channel; and
operating a second point-to-point communication channel between the instrument module and a third instrument module in another one of the slots of the mainframe simultaneously to the first point-to-point communication channel.

21. A method of communicating in an instrument including a mainframe having a number of slots each structured to accept an instrument module, the method comprising:
  establishing a broadcast communication channel on a communication bus between a first instrument module in one of the slots and the mainframe; and
  establishing a point-to-point communication channel between the instrument module and a second instrument module in any other one of the slots of the mainframe, in which the point-to-point communication channel is a first point-to-point communication channel; and
operating a second point-to-point communication channel between a third instrument module and a fourth instrument module simultaneously to the first point-to-point communication channel.

* * * * *